US010205472B2

(12) United States Patent
Hu et al.

(10) Patent No.: US 10,205,472 B2
(45) Date of Patent: Feb. 12, 2019

(54) RADIO UNIT HOUSING AND A BASE STATION ANTENNA MODULE

(71) Applicant: Huawei Technologies Co., Ltd., Shenzhen, Guangdong (CN)

(72) Inventors: Weifeng Hu, Shanghai (CN); Antonios Monokrousos, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/686,686

(22) Filed: Aug. 25, 2017

(65) Prior Publication Data

US 2018/0019769 A1   Jan. 18, 2018

Related U.S. Application Data

(63) Continuation of application No. PCT/EP2015/053996, filed on Feb. 26, 2015.

(51) Int. Cl.
*H04B 1/036* (2006.01)
*H01Q 1/02* (2006.01)
*F28F 3/02* (2006.01)
*H01Q 1/12* (2006.01)
*H01Q 1/18* (2006.01)
*H05K 7/20* (2006.01)
*H01Q 1/24* (2006.01)
*H04B 1/24* (2006.01)

(52) U.S. Cl.
CPC ............. *H04B 1/036* (2013.01); *F28F 3/02* (2013.01); *H01Q 1/02* (2013.01); *H01Q 1/1207* (2013.01); *H01Q 1/18* (2013.01); *H01Q 1/246* (2013.01); *H05K 7/20154* (2013.01); *H05K 7/20409* (2013.01)

(58) Field of Classification Search
CPC .......... H04B 1/036; F28F 3/02; H01L 23/467; H01L 23/3672; H05K 7/20136–7/20172; H05K 7/20409; G06F 1/181–1/183; G06F 2200/201
USPC ............ 361/679.54, 688–697, 720; 343/878, 343/848; 248/220.21, 220.22, 222.11; 165/80.3; 174/547–548, 16.1
See application file for complete search history.

(56) References Cited

U.S. PATENT DOCUMENTS

| | | | | |
|---|---|---|---|---|
| 5,613,225 A | * | 3/1997 | Charas | H01Q 21/0087 343/853 |
| 5,828,339 A | * | 10/1998 | Patel | H01Q 1/246 343/700 MS |
| 5,892,481 A | * | 4/1999 | Andersson | H01Q 1/02 343/700 MS |
| 6,396,443 B1 | * | 5/2002 | Conklin | H01Q 1/22 343/702 |
| 7,043,280 B1 | | 5/2006 | Shields et al. | |
| 2004/0150956 A1 | * | 8/2004 | Conte | H01L 23/3677 361/709 |

(Continued)

FOREIGN PATENT DOCUMENTS

DE   202009001821 U1   4/2009
KR   20140128214 A   11/2014

*Primary Examiner* — Dion Ferguson
*Assistant Examiner* — Amir A Jalali

(57) ABSTRACT

A radio unit housing configured to receive a corresponding antenna and configured such that, when the antenna is received by the radio unit housing an air channel is formed between the radio unit housing and the antenna.

13 Claims, 5 Drawing Sheets

(56) References Cited

U.S. PATENT DOCUMENTS

| | | | | |
|---|---|---|---|---|
| 2012/0001809 A1* | 1/2012 | Peng | ................ | H01Q 1/02 |
| | | | | 343/702 |
| 2013/0088402 A1* | 4/2013 | Lindmark | ............ | H01Q 1/246 |
| | | | | 343/848 |
| 2013/0299125 A1* | 11/2013 | Shi | ................ | H01L 23/467 |
| | | | | 165/47 |
| 2016/0073551 A1* | 3/2016 | Park | ................ | H05K 1/0203 |
| | | | | 174/252 |
| 2016/0261030 A1 | 9/2016 | Kim et al. | | |

* cited by examiner

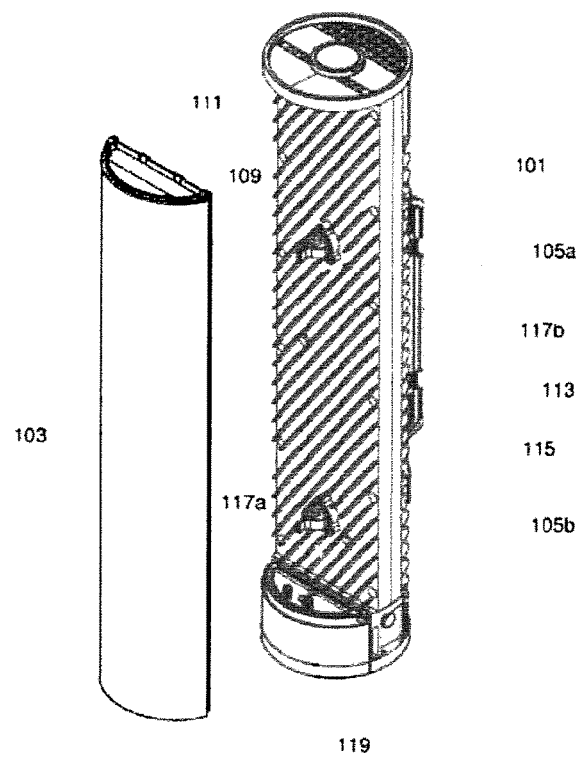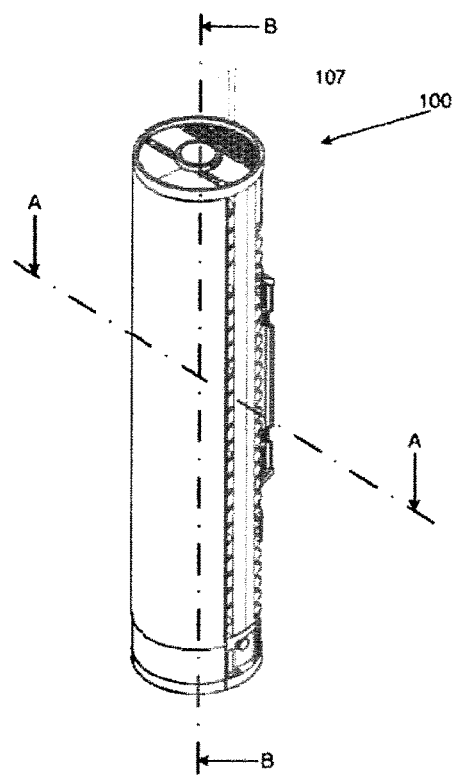
Fig. 1a
Fig. 1b

RADIO UNIT HOUSING AND A BASE STATION ANTENNA MODULE

CROSS-REFERENCE TO RELATED APPLICATIONS

This application is a continuation of International Application No. PCT/EP2015/053996, filed on Feb. 26, 2015, the disclosure of which is hereby incorporated by reference in its entirety.

TECHNICAL FIELD

Embodiments of the present application relate to a radio unit housing, for example, for a radio unit of a base station. Further embodiments relate to a base station antenna module comprising such radio unit housing.

BACKGROUND

New base station antenna systems integrate the radio unit and the antenna to one compact base station antenna module. Such a module is a significant advancement compared to traditional base stations with respect to site location, installation, operation and maintenance. At the same time, operators require high output power, light weight, small size, etc., which put forward higher heat requirements for the radio unit and the antenna. Traditionally the main radiator of the Radio Unit was mostly constructed of straight fins, with the air flowing from the bottom of the radiator into the unit and discharged from the top. There is an optimal working point for the straight fins, with respect to fin spacing based on the internal heat consumption, radiator height, target temperature.

A conventional solution to improve the cooling for the above mentioned modules is to increase the cooling area, which will increase the volume of the product, and its total weight. This increase in volume does not meet the objectives of the operators to reduce the overall appearance of the site. The increase in weight would have higher requirements for installation on a tower or a pole, and does not allow for reduced costs for the carriers.

Another solution is to use forced cooling with fans. These fans require power supply and control, and can't meet the operators' requirement for simple maintenance and operation.

The increase of cooling power leads to further difficulties in meeting the operators' requirement.

SUMMARY

It is an object of the present disclosure to provide an improved concept for cooling a radio unit.

The foregoing and other objects are achieved by the features of the independent claims. Further implementation forms are apparent from the dependent claims, the description and the figures.

According to a first aspect, a radio unit housing is provided configured to receive a corresponding antenna and configured such that, when the antenna is received by the radio unit housing an air channel is formed between the radio unit housing and the antenna.

By having the radio unit housing be configured such that when the antenna is received by the radio unit housing an air channel is formed, a compact antenna design can be achieved which still enables an efficient cooling of a radio unit inside the housing.

In a first possible implementation form of the radio unit housing according to the first aspect, the radio unit housing further includes at least an antenna holder configured to hold the antenna and to space the antenna from a backside of the radio unit housing such that when the antenna is held by the holder the air channel is formed between the backside of the radio unit housing and an opposing backside of the antenna.

In a second possible implementation form of the radio unit housing according to the first implementation form, the holder includes a connector for establishing an electrical connection between a radio unit of the radio unit housing and the antenna.

In a third possible implementation form of the radio unit housing according to any preceding implementation form or the first aspect as such, the radio unit housing further includes a heat sink arranged at the outside of the radio unit housing at a backside of the radio unit housing and facing the antenna, when the antenna is received by the radio unit housing. The heat sink is configured to dissipate heat from a radio unit inside the radio unit housing. The air channel runs along the heat sink.

In a fourth possible implementation form of the radio unit housing according to the third implementation form, the heat sink has a plurality of straight fins forming the air channel.

In a fifth possible implementation form of the radio unit housing according to the fourth implementation form, at least a part of the plurality of straight fins extends from a first long side of the radio unit housing to a second long side of the radio unit housing. For example such that air can enter the air channel at the first long side and leave the air channel at the second long side, thereby heating up and dissipating heat from the heat sink.

In a sixth possible implementation form of the radio unit housing according to the third or fourth implementation form, the straight fins are inclined in an angle between 25° and 45° relative to a long side of the radio unit housing.

In a seventh possible implementation form of the radio unit housing according to the third implementation form, the straight fins extend from a first short side of the radio unit housing to a second short side of the radio unit housing.

In an eighth possible implementation form of the radio unit housing according to the seventh implementation form, the radio unit housing further includes a ventilation unit arranged along the air channel.

In a ninth possible implementation form of the radio unit housing according to the seventh or eighth implementation form, a ratio between a length of the radio unit housing in which the straight fins extend and a length of the first short side is smaller than or equal to 1.5.

In a tenth possible implementation form of the radio unit housing according to the second implementation form, the heat sink includes pin fins forming the air channel.

In an eleventh possible implementation form of the radio unit housing according to any preceding implementation form or the first aspect as such, the radio unit housing further includes a radio unit arranged inside the radio unit housing. A filter of the radio unit is arranged inside the radio unit housing at a backside of the radio unit housing, the backside facing the antenna when the antenna is received by the radio unit housing.

According to a second aspect, a base station antenna module is provided having a radio unit housing according to any of the preceding implementation forms of the first aspect or the first aspect as such and an antenna attached to the radio unit housing such that the air channel is formed between the radio unit housing and the antenna.

BRIEF DESCRIPTION OF THE DRAWINGS

FIG. 1a shows a radio unit housing together with an antenna according to an embodiment of the present disclosure;

FIG. 1b shows the radio unit housing and the antenna from FIG. 1a assembled to each other forming a base station antenna module according to an embodiment of the present disclosure;

DETAILED DESCRIPTION

Figure 2A:
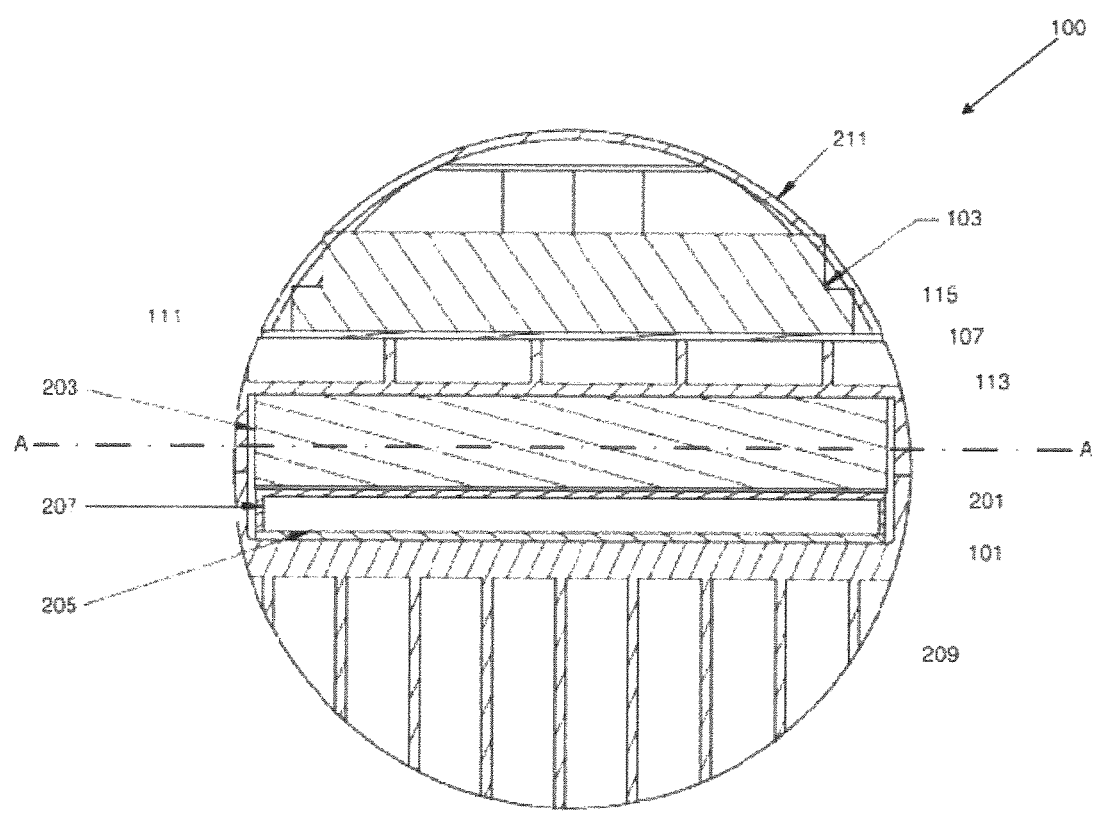
FIG. 2a shows a cross sectional view through the base station antenna module of FIG. 1b.

FIG. 1a shows a (base station) radio unit housing 101 together with a corresponding (base station) antenna 103 according to an embodiment of the present disclosure. In an assembled state, the radio unit housing unit 101 and the antenna 103 form a base station antenna module 100 as shown in FIG. 1b.

The radio unit housing 101 is configured to receive the corresponding antenna 103. In other words, the radio unit housing may comprise an arrangement (such as at least one (antenna) holder 105a, 105b) for holding the antenna 103. Furthermore, the radio unit housing 101 is configured to receive the antenna 103 such that, when the antenna 103 is received by the radio unit housing 101, an air channel 107 is formed between the radio unit housing 101 and the antenna 103. This can be achieved for example by choosing the holders 105a, 105b such that a backside 109 of the antenna 103 and an opposing backside 111 of the radio unit housing 101 are spaced from each other. The air channel 107 is then formed between the two backsides 109, 111.

The air channel 107 between the radio unit housing 101 and the antenna 103 enables an efficient cooling of a radio unit inside the radio unit housing 101 but also a compact design of the complete base station antenna module 100.

The embodiment shown in FIG. 1a includes a first antenna holder 105a and a second antenna holder 105b. The antenna holders 105a, 105b are configured to hold the antenna 103 and to space the antenna 103 from the backside 111 of the radio unit housing 101 such that, when the antenna 103 is held by the holders 105a, 105b, the air channel 107 is formed between the backside 111 of the radio unit housing 101 and an opposing backside 109 of the antenna 103. Hence, the holders 105a, 105b actually have two functions: firstly holding the antenna 103 in place and secondly spacing the antenna 103 from the radio unit housing 101, thereby achieving the air channel 107 between the antenna 103 and the radio unit housing 101.

Furthermore, at least one of the holders 105a, 105b may include at least one connector for establishing an electrical connection between a radio unit of the radio unit housing 101 and the antenna 103. Hence, such holder 105a, 105b can even function as an electrical connector used for transmitting signals between the radio unit inside the radio unit housing 101 and the antenna 103. Typically several connectors are deployed at the backside of the radio unit housing 101. Every of such connector can meet the IP65 requirements. According to further embodiments, at least some of the connectors can also be independent from the holders (i.e. do not provide a mechanical function for holding the antenna but only establishing an electrical connection).

Although in the shown embodiment the radio unit housing 101 includes two holders 105a, 105b, according to further embodiments at least one holder may be sufficient. Furthermore, according to further embodiment also a larger number of holders can be employed at the radio unit housing 101.

The radio unit housing 101 includes a heat sink 113 arranged at the outside of the radio unit housing 101 at the backside 111 of the radio unit housing 101. It can be seen that the heat sink 113 faces the antenna 103, when the antenna 103 is received by the radio unit housing 101. The heat sink 113 is configured to dissipate heat from a radio unit inside the radio unit housing 101. Furthermore, when the antenna 103 and the radio unit housing 101 are assembled to each other, the air channel 107 runs along the heat sink 113. By having the heat sink 113 arranged in the air channel 107 air travelling along the air channel 107 can be used to dissipate heat from the heat sink 113. The heat sink 113 is thermally conductive connected to the radio unit (for example a filter of the radio unit) inside the radio unit housing 101. Hence, an efficient heat dissipation from the radio unit to air travelling through the air channel 107 can be achieved via the heat sink 113.

As shown in FIGS. 1a and 1b, the heat sink 113 includes a plurality of parallel and straight fins 115 forming the air channel 107. The straight fins 115 further enlarge the surface area of the heat sink 113 and therefore provide improved heat dissipation when compared to a totally flat backside of 111 of the radio unit housing 101.

At least a part of the plurality of straight fins 115 extend from a first long side 117a of the radio unit housing 101 to a second long side 117b of the radio unit housing 101. Air can enter the air channel 107 at the first long side 117a travel along the air channel 107 and leave the air channel 107 at the second long side 117b. As air travels through the air channel 107, the air heats up and dissipates heat from the heat sink 113.

A height of the fins 115 can be chosen corresponding to a height of the holders 105a, 105b. For example such that, when the antenna 103 is received by the radio unit housing 101 top edges of the fins 115 are in contact with the backside 109 of the antenna 103 or an air gap of at maximum 1mm is remaining between a top edge of a fin 115 and the backside 109 of the antenna 103.

The straight fins 115 can be inclined in an angle between 25° and 45° relative to a long side (such as the first long side 117a) of the radio unit housing 101. The angle can be chosen in dependence on a ratio between height (along the long sides 117a, 117b) and width (along the short side 119) of the radio unit housing 101. In a preferred embodiment the inclination angle is 35°±10%. In other words, the inclination will depend on the aspect ratio (height to width) of the unit, i.e. higher aspect ratio gives a higher inclination angle.

Figure 3:
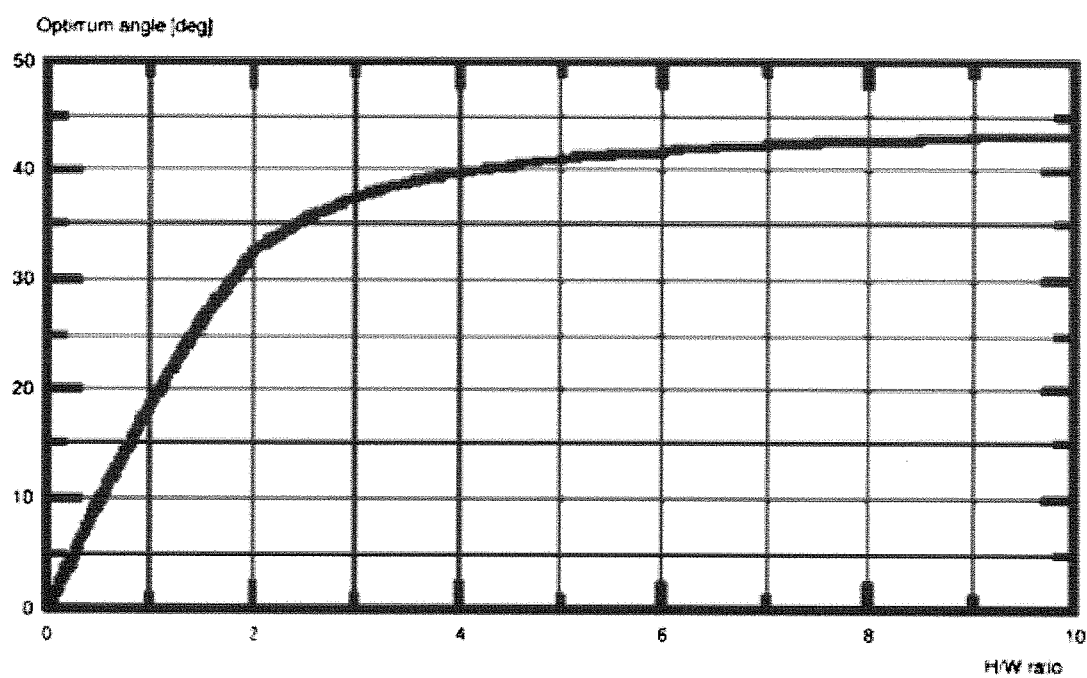
FIG. 3 shows the relationship between the optimal inclination angle of straight fins in degree (Y-Axis) and the aspect ratio (X-Axis)

FIG. 3 shows the relationship between the optimal inclination angle of the straight fins relative to the long side 117a in degree (Y-Axis) and the mentioned aspect ratio (X-Axis) of the radio unit housing 101.

A width of the air channel (which corresponds to a distance between the backside 111 of the radio unit housing and the backside 109 of the antenna 103 when assembled to each other or to the height of straight fins 115 when they are in contact with the backside 109 of the antenna 103) can be chosen in the range from 8 mm to 20 mm. In a preferred embodiment the width of the air channel is 10 mm±10%.

Figure 2B:
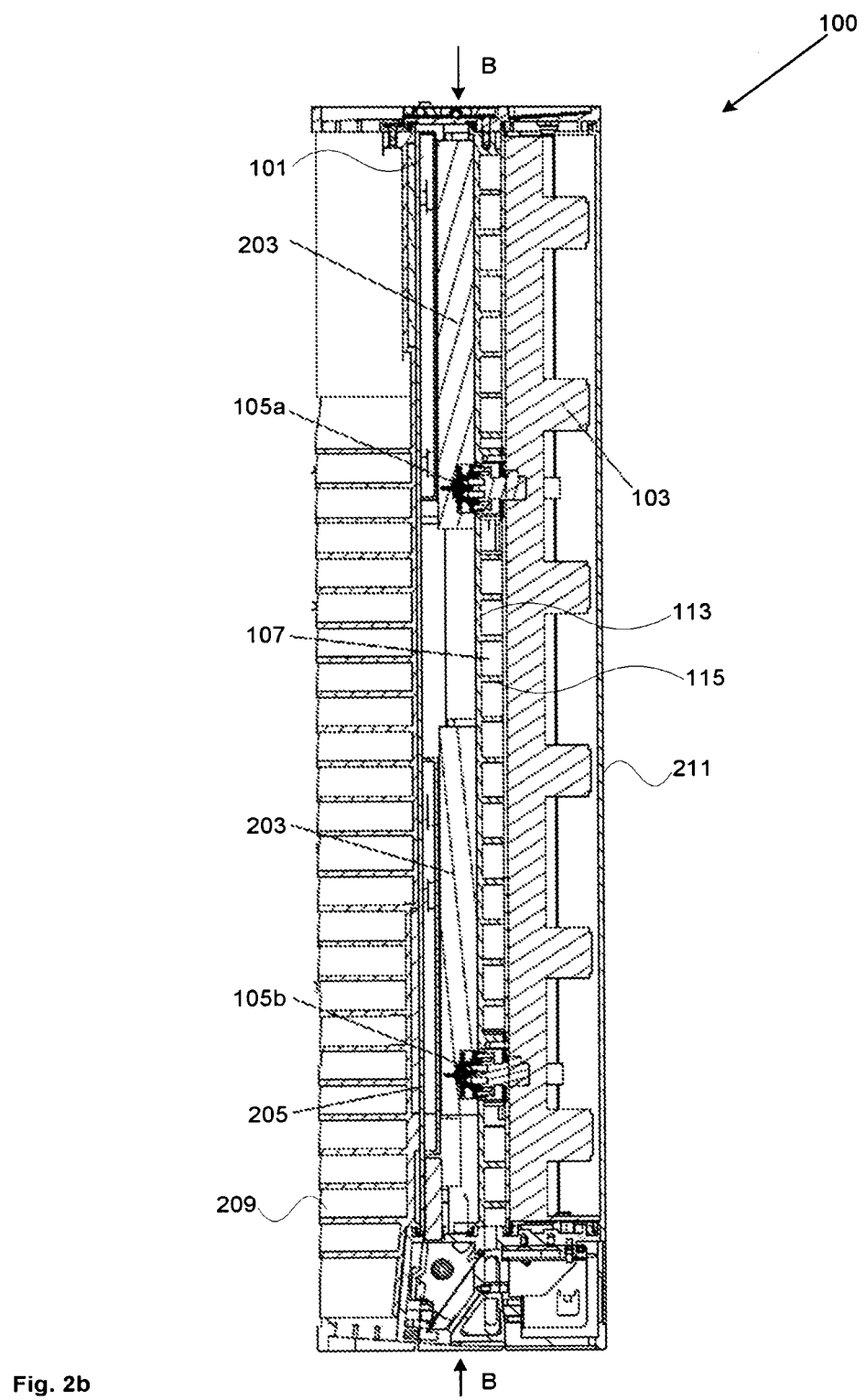
FIG. 2b shows a further cross sectional view through the base station antenna module of FIG. 1b.

FIG. 2a shows a cross sectional view along lines A-A (in width direction) through the base station antenna module 100 of FIG. 1b. FIG. 2b shows a cross sectional view along line B-B (in length direction) through the base station antenna module 100 of FIG. 1b.

In FIGS. 2a and 2b a possible arrangement for elements of a radio unit 201 (as mentioned above) inside the radio unit housing 101 is shown. The radio unit 201 includes a filter 203. As shown in FIGS. 2a and 2b, the filter 203 is arranged inside the radio unit housing 101 at the backside 111 of the radio unit housing 101 which faces the antenna 103. In other words, the radio unit 201 (in more detail the filter 203) is thermally conductive connected to the heat sink 113, such that heat generated at the radio unit 201 (and especially at the filter 203) can be effectively dissipated from the radio unit 201 (and especially the filter 203) by means of the heat sink 113.

The radio unit 201 includes a PCB 205 having the signal processing devices of the radio unit 201 and an EMC cover 207 arranged between the PCB 205 and the filter 203.

Furthermore, the radio unit housing 101 further includes a heat sink 209 arranged at an opposite side (e.g. front side) of the radio unit housing 101 than the heat sink 113 (facing the antenna 103). Heat sink 209 can be thermally conductive connected to the radio unit 201 for dissipating heat from the heat radio unit 201 (e.g., heat mainly generated by the devices on the PCB 205).

The base station antenna module 100 includes a radome 211 for protecting the antenna 103 from environmental influences.

According to a further embodiment, the straight fins 115 extend from a first short side (like a bottom side) of the radio unit housing 101 to a second short side (like a top side) of the radio unit housing 101. In such embodiments a ventilation unit may be arranged along the air channel, for example at the first short and/or second short side to provide sufficient air flow along the air channel 107, Furthermore, in such embodiment an aspect ratio between height (along the long sides of the radio unit housing) and width (along the short sides of the radio unit housing) may be equal to or less than 1.5. In other words, a ratio between a length of the radio unit housing in which the straight fins extend and a length of the first short side is smaller than or equal to 1.5. The additional manufacturing cost of the inclined fins outweighs their cooling advantage for aspect ratio less than 1.5. In that case a straight fin solution is preferred.

Figure 4:
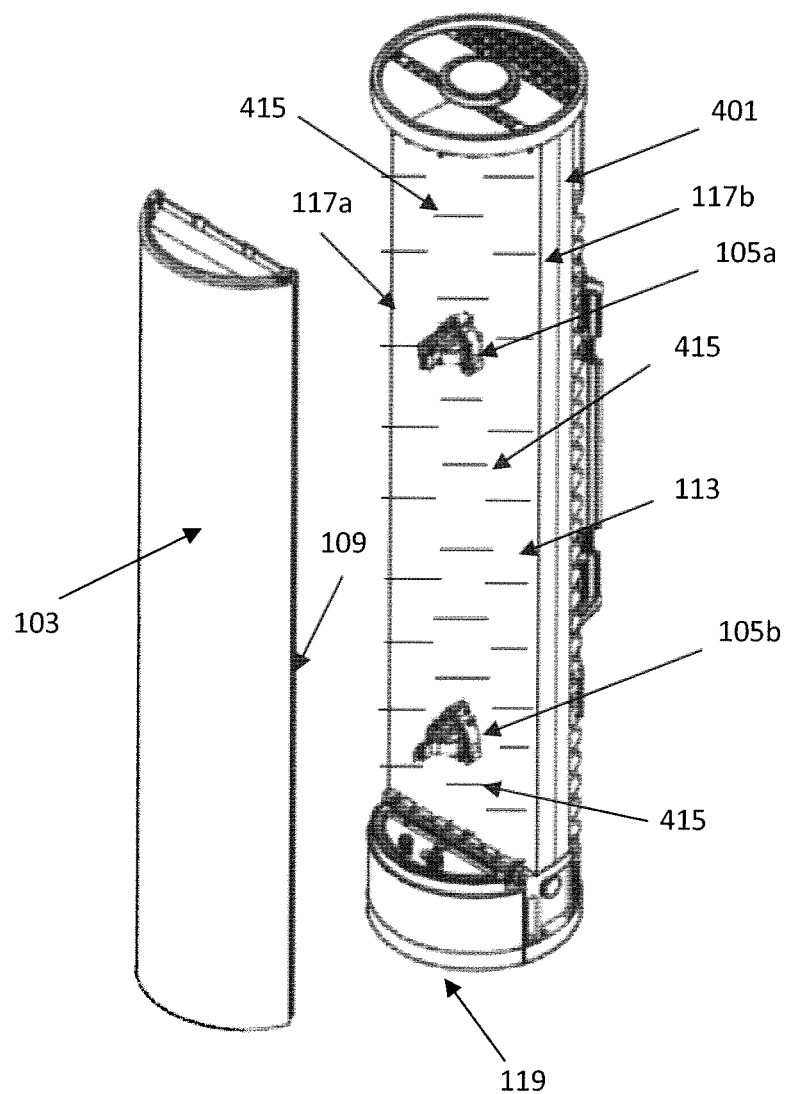
FIG. 4 shows another radio unit housing together with an antenna according to an embodiment of the present disclosure.

According to a further embodiment, the heat sink 113 comprises pin fins forming the air channel 107 instead the straight fins 115. Pin fins provide an even larger area surface for heat dissipation. FIG. 4 shows another radio unit housing 401 together with an antenna 103 according to an embodiment of the present disclosure. FIG. 4 includes one or more features described herein with respect to FIGS. 1a, 1b, 2a, 2b, and 3. For example, FIG. 4 illustrates the antenna 103 having the backside 109 and the radio unit housing 401 having the first antenna holder 105a, the second antenna holder 105b, the backside 111, the heat sink 113, the first long side 117a, the second long side 117b, and the short side 119. As an alternative to the straight fins 115 of the radio housing unit 101 illustrated in FIG. 1a, the radio unit housing 401 may include pin fins 415. The heat sink 113 may include the pin fins 415 forming the air channel 107 instead of the straight fins 115. The pin fins 415 may provide an even larger area surface for heat dissipation when compared to the straight fins 115.

What is claimed is:

1. An apparatus, comprising:
 a radio unit housing configured to receive a corresponding antenna;
 an air channel formed between the radio unit housing and the antenna when the antenna is received by the radio unit housing; and
 a holder extending into the air channel a distance away from a first long side, a second long side, a first short side, and a second short side of a heat sink and configured to hold the antenna when the antenna is received by the radio unit housing.

2. The apparatus according to claim 1, wherein the holder is configured to space the antenna from a backside of the radio unit housing, wherein when the antenna is held by the holder, the air channel is formed between the backside of the radio unit housing and an opposing backside of the antenna.

3. The apparatus according to claim 2, wherein the holder comprises a connector for establishing an electrical connection between the antenna and a radio unit in the radio unit housing.

4. The apparatus according to claim 1, wherein the heat sink is arranged outside of the radio unit housing at a backside of the radio unit housing and faces the antenna when the antenna is received by the radio unit housing, wherein the heat sink is configured to dissipate heat from a radio unit inside the radio unit housing, and wherein the air channel runs along the heat sink.

5. The apparatus according to claim 4, wherein the heat sink comprises a plurality of straight fins forming the air channel.

6. The apparatus according to claim 5, wherein at least a part of the plurality of straight fins extends from the first long side of the heat sink to the second long side of the heat sink.

7. The apparatus according to claim 5, wherein the straight fins are inclined in an angle between 25° and 45° relative to at least one of the first long side of the heat sink or the second long side of the heat sink.

8. The apparatus according to claim 5, wherein the straight fins extend from the first short side of the heat sink to the second short side of the heat sink.

9. The apparatus according to claim 8, wherein the radio unit housing further comprises a ventilation unit arranged along the air channel.

10. The apparatus according to claim 8, wherein a ratio between a length of the first long side of the heat sink and a length of the first short side of the heat sink is less than or equal to 1.5.

11. The apparatus according to claim 4, wherein the heat sink comprises pin fins forming the air channel.

12. The apparatus according to claim 1, further comprising:
 a radio unit arranged inside the radio unit housing; and
 a filter of the radio unit arranged inside the radio unit housing at a backside of the radio unit housing, wherein the backside of the radio unit housing faces the antenna when the antenna is received by the radio unit housing.

13. A base station antenna module, comprising:
 a radio unit housing;
 an antenna configured to attach to the radio unit housing;
 an air channel formed between the radio unit housing and the antenna when the antenna is attached to the radio unit housing; and a holder extending into the air channel a distance away from a first long side, a second long side, a first short side, and a second short side of a heat sink and configured to hold the antenna when the antenna is attached to the radio unit housing.

* * * * *